(12) United States Patent
Liang et al.

(10) Patent No.: US 11,876,345 B2
(45) Date of Patent: Jan. 16, 2024

(54) THERMAL MANAGEMENT FOR HYBRID LASERS

(71) Applicant: HEWLETT PACKARD ENTERPRISE DEVELOPMENT LP, Houston, TX (US)

(72) Inventors: Di Liang, Santa Barbara, CA (US); Chih C. Shih, San Jose, CA (US); Kevin B. Leigh, Houston, TX (US); Geza Kurczveil, Santa Barbara, CA (US); Marco Fiorentino, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 413 days.

(21) Appl. No.: 17/015,001

(22) Filed: Sep. 8, 2020

(65) Prior Publication Data
US 2022/0077656 A1    Mar. 10, 2022

(51) Int. Cl.
*H01S 5/024* (2006.01)
*H01S 5/0237* (2021.01)
(Continued)

(52) U.S. Cl.
CPC ........ *H01S 5/02469* (2013.01); *H01S 5/0237* (2021.01); *H01S 5/0239* (2021.01);
(Continued)

(58) Field of Classification Search
CPC ........ H01S 5/185–187; H01S 5/02461–02476; H01S 5/0237; H01S 5/0239; H01S 5/02469; H01L 23/433; H01L 23/4338
See application file for complete search history.

(56) References Cited

U.S. PATENT DOCUMENTS

| 5,287,001 A | * | 2/1994 | Buchmann | ............ | H01L 23/433 |
| | | | | | 257/E23.09 |
| 5,350,713 A | * | 9/1994 | Liang | ................. | H01L 23/315 |
| | | | | | 257/E23.128 |

(Continued)

FOREIGN PATENT DOCUMENTS

WO    WO-2012070463 A1 *  5/2012  .............. F28F 21/04

OTHER PUBLICATIONS

Yuan, T.D et al.; "Thermal Interface Material (TIM) Design Guidance for Flip Chip BGA Package Thermal Performance"; Oct. 2004; 6 pgs.; ALTERA, San Jose, CA, USA.

*Primary Examiner* — Sean P Hagan
(74) *Attorney, Agent, or Firm* — Sheppard Mullin Richter & Hampton LLP

(57) ABSTRACT

Techniques and systems for a semiconductor laser, namely a grating-coupled surface-emitting (GCSE) comb laser, having thermal management for facilitating dissipation of heat, integrated thereon. The thermal management is structured in manner that prevents deformation or damage to the GCSE laser chips included in the semiconductor laser implementation. The disclosed thermal management elements integrated in the laser can include: heat sinks; support bars; solder joints; thermal interface material (TIM); silicon vias (TSV); and terminal conductive sheets. Support bars, for example, having the GCSE laser chip positioned between the bars and having a height that is higher than a thickness of the GCSE laser chip. Accordingly, the heat sink can be placed on top of the support bars such that heat is dissipated from the GCSE laser chip, and the heat sink is separated from directed contact with the GCSE laser chip due to the height of the support bars.

9 Claims, 8 Drawing Sheets

(51) Int. Cl.
*H01S 5/0239* (2021.01)
*H01S 5/187* (2006.01)
*H01S 5/40* (2006.01)
*H01S 5/00* (2006.01)

(52) U.S. Cl.
CPC .......... *H01S 5/02476* (2013.01); *H01S 5/187* (2013.01); *H01S 5/0085* (2013.01); *H01S 5/4025* (2013.01)

(56) References Cited

U.S. PATENT DOCUMENTS

| | | | | |
|---|---|---|---|---|
| 5,616,520 A | * | 4/1997 | Nishiuma | H01L 23/10 257/E23.09 |
| 5,621,615 A | | 4/1997 | Dawson et al. | |
| 5,847,929 A | * | 12/1998 | Bernier | H01L 23/433 257/E23.09 |
| 5,940,271 A | | 8/1999 | Mertol | |
| 6,212,070 B1 | | 4/2001 | Atwood et al. | |
| 8,216,887 B2 | | 7/2012 | Heng et al. | |
| 8,411,711 B2 | * | 4/2013 | Gubenko | B82Y 20/00 372/50.1 |
| 2004/0265489 A1 | * | 12/2004 | Dubin | H01L 21/4871 257/E23.09 |
| 2009/0232991 A1 | * | 9/2009 | Wang | H01L 23/373 427/299 |
| 2011/0265980 A1 | * | 11/2011 | Kubo | H01L 23/4275 428/137 |
| 2013/0051414 A1 | * | 2/2013 | Grove | H01S 5/024 372/36 |
| 2014/0192832 A1 | * | 7/2014 | Shih | H01L 25/00 372/44.01 |
| 2016/0150680 A1 | * | 5/2016 | Aramaki | H01L 23/3737 165/185 |
| 2016/0165748 A1 | * | 6/2016 | Chen | B23P 15/26 29/890.03 |
| 2016/0233141 A1 | | 8/2016 | Hirobe | |
| 2020/0144151 A1 | * | 5/2020 | Bettman | G02B 6/4269 |

* cited by examiner

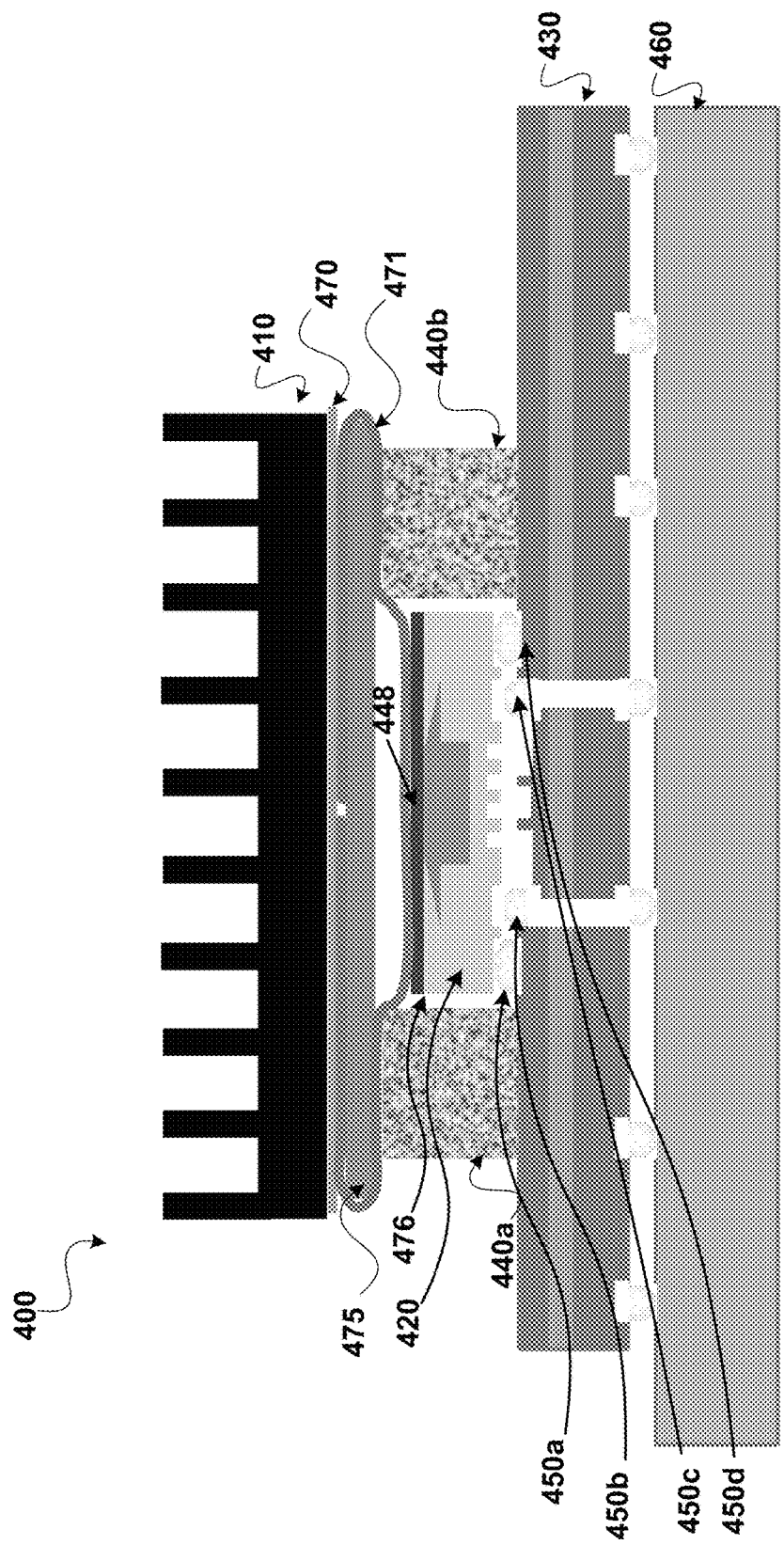
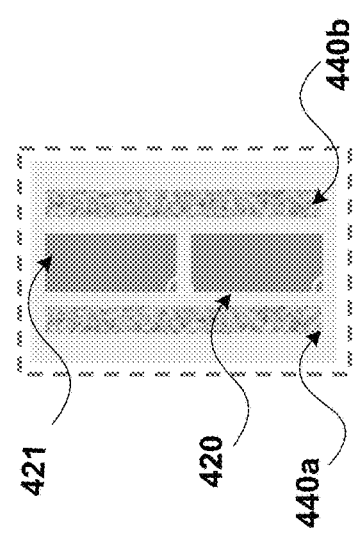
FIG. 4A
FIG. 4B

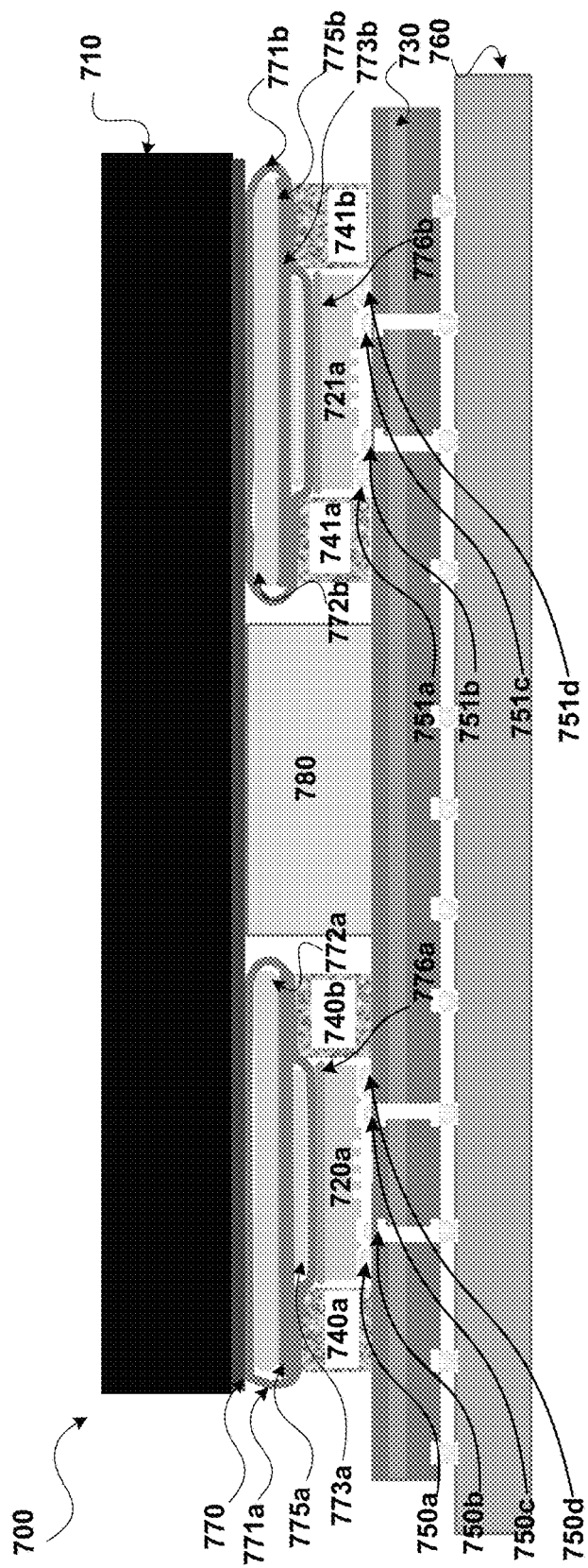
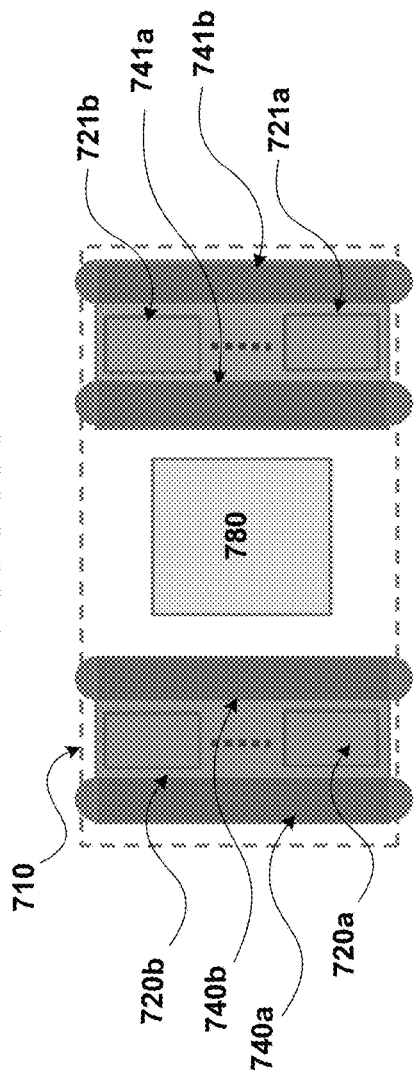
FIG. 7A
FIG. 7B

THERMAL MANAGEMENT FOR HYBRID LASERS

STATEMENT OF GOVERNMENT RIGHTS

This invention was made with Government support under Agreement Number H98230-19-3-0002. The Government has certain rights in the invention.

BACKGROUND

Dense Wavelength Division Multiplexing (DWDM) is an optical multiplexing technology that can be used to increase bandwidth over existing fiber networks. DWDM typically consists of combining and transmitting multiple signals simultaneously, at different wavelengths, on the same fiber, thus multiplying the capacity of the physical medium. DWDM interconnects using nanophotonics, in general, can offer orders of magnitude improved bandwidth and energy efficiency over electrical interconnects. Emerging multi-core computing systems, which often require an interconnect fabric that provides high throughput at low power with a small footprint, may lend themselves to employ DWDM technology.

Typically, optical systems, such as DWDM, employ lasers to generate optical signals. Typical semi-conductor lasers can emit photons based on recombining positive electrical carriers in an active region. In the case of electrically driven lasers, this process is in response to generating a current through respective positive and negative doped regions and metal electrodes in the laser.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 4A is a diagram of another example of a GCSE comb laser with integrated thermal management elements including a thermal conductive sheet, according to some embodiments.

FIG. 4B depicts a top view of the GCSE comb laser with integrated thermal management elements shown in FIG. 3A.

FIG. 7A is a diagram of yet another example of a GCSE comb laser with integrated thermal management elements including the application specific integrated circuit (ASIC) separating multiple GCSE chips sharing the same heat sink, according to some embodiments.

FIG. 7B depicts a top view of the GCSE comb laser with integrated thermal management elements shown in FIG. 7A.

The figures are not exhaustive and do not limit the present disclosure to the precise form disclosed.

DETAILED DESCRIPTION

Various embodiments described herein are directed to an semiconductor laser, namely a grating-coupled surface-emitting (GCSE) comb lasers having thermal management for facilitating dissipation of heat, integrated thereon. Semiconductor optoelectronic components are typically subject to temperature variation which can change the material refractive index, and impact wavelength-sensitive structures and applications. Joule heating in diode lasers is a critical factor in device operation and packaging. It affects lasing wavelength, efficiency, and lifetime. GCSE comb lasers can be useful in implementing optical interconnects, such as in DWDM systems. Upon laser chip fabrication, laser chip(s) can be flip-chip bonded onto a Silicon-on-Insulator (SOI) photonic interposer. Surface emission of the laser's output should be coupled into the silicon waveguide in SOI photonic interposer.

A physical gap between the grating couplers on the laser chip and SOI interposer are often times inevitably form. This distance is the gap needs to be remained constant to a designed value in order to minimize optical coupling loss and reflections. Thus, it may be challenging to employ typical thermal management elements, such as heat sinks, in GCSE comb lasers. For instance, attaching a heat sink physically to the backside of a laser chip, as in some conventional approaches, can deform or even damage the thin (e.g., approximately 150 um in thickness) laser chip due to the mechanical force applied during heat sink attachment process. However, the disclosed GCSE comb lasers have a unique design that enables efficient thermal management without deformation or damage to the laser chips.

Figure 1:
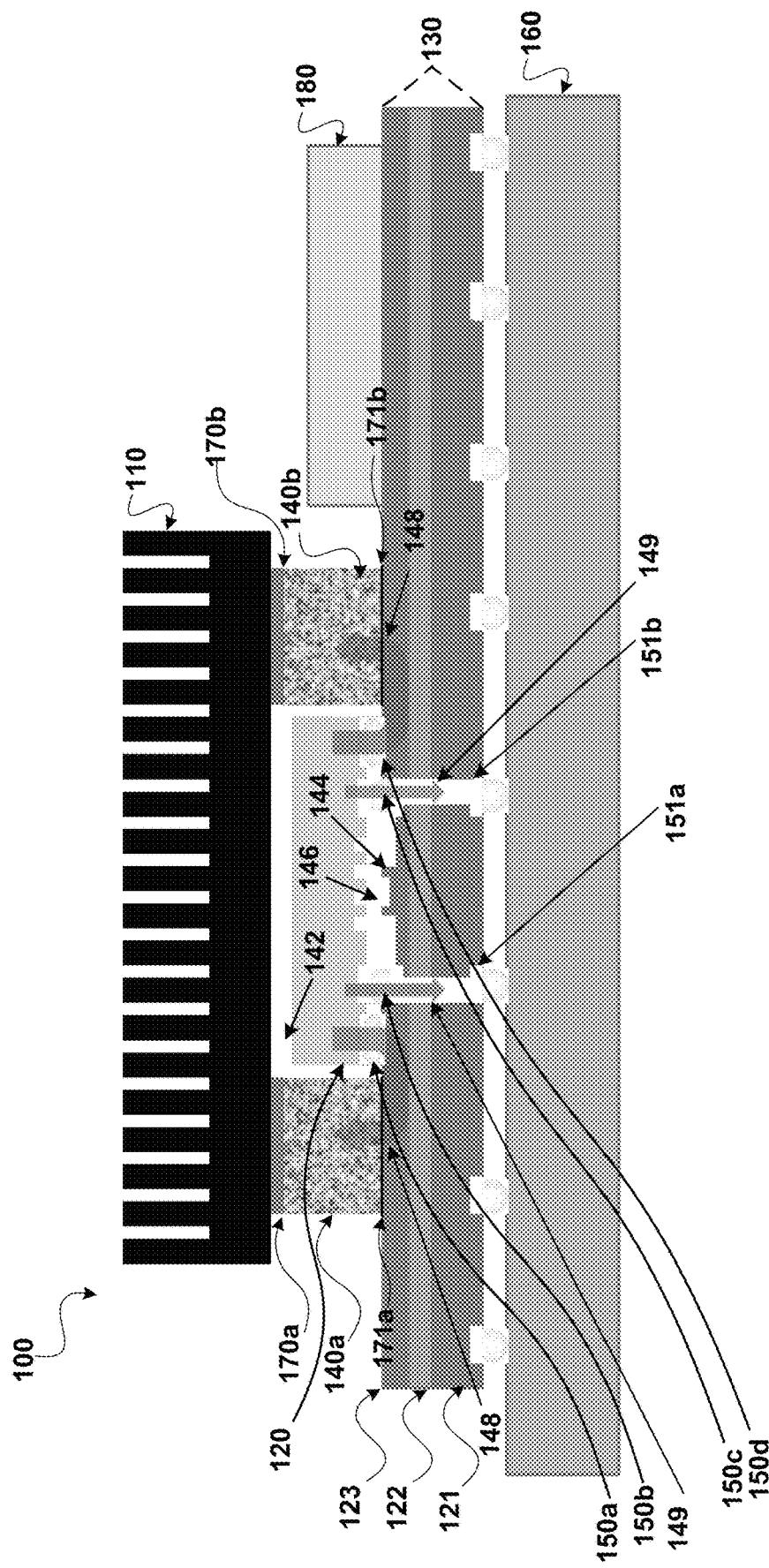
FIG. 1 is a diagram of an example of a grating-coupled surface-emitting (GCSE) comb laser with integrated thermal management elements, according to some embodiments.

Referring now to FIG. 1, is a GCSE comb laser 100 configured with thermal management elements is shown. The laser 100 can include a GCSE laser chip 120 that is bonded onto a SOI Si photonic interposer layer 130. In the illustrated example, the thermal management elements of the laser 100 can include a heat sink 110, and heat spreaders including support bars 140a, 140b and solder joints 150a-150d. The laser 100 can be employed as a light source for optical signal modulators in a variety of optical systems, such as in optical interconnect systems and optical communication systems. For purposes of discussion, the GCSE laser chip 120 is described as a multiple-wavelength semiconductor laser. That is, the GCSE laser chip 120 may produce a spectrum of light having a series of discrete, equally-spaced frequency elements that will be referred to as multiple carrier wavelengths.

In FIG. 1, the cross-sectional view, prominently illustrates the multiple layers of materials that may be deposited on an organic substrate 160 for fabricating the laser 100. In the illustrated example, layers 121, 122, and 123 may collectively make up a SOI Si photonic interposer 130. For example, layer 121 is a substrate layer. Layer 122 is a buried oxide (BOX) layer, which can be formed from silicon dioxide ($SiO_2$). On top of layer 122 can be a silicon layer 123. The organic substrate 160 can be a silicon substrate that is beneath the SOI Si photonic interposer 130. Additionally, a photonic die 180 of an application specific integrated circuit (ASIC) is shown to be disposed on top of the SOI Si photonic interposer 130. The photonic die 180 may comprise optical signal modulators (not shown) that use the multiple carrier wavelengths generated by the GCSE laser chip 120. An electronic die may be present (not shown) above the photonic die 180.

In the example of FIG. 1, the heat sink 110 is positioned over the GCSE laser chip 120, without physically resting against the GCSE laser chip 120 itself. Particularly, the heat sink 110 is positioned above the backside of the GCSE laser chip 120 with a heat sink air gap 142. That is, FIG. 1 serves to illustrate that the heat sink 110 does not directly come into contact with the GCSE laser chip 120. This distinct configuration for the laser 100 avoids the mechanical force that results from attaching a heat sink directly to the chip, which could potentially damage or deform the GCSE laser chip. Mechanical attachments for the heat sink 110 are not shown for brevity. As seen in FIG. 1, the heat sink 110 is placed on support bars 140a, 140b. The heat sink 110 physically comes into contact with layers of thermal interface material (TIM) 170a, 170b that are placed on the top surfaces of each support bar 140a, 140b, respectively.

FIG. 1 also shows multiple solder joints 150a-150d, which are arranged at various points about the flip-chip bonded GCSE laser chip 120 on the SOI Si photonic interposer 130. The solder joints 150a-150d can extract joule heat from the GCSE laser chip 120 and spread this extracted heat along top Si layer 123. The TIM 170 serves as the thermal interface for indirectly conducting heat from the GCSE chip 120 to the heat sink via the TIM 170. Accordingly, heat from GCSE laser chip 120 can dissipate through the solder joints 150a-150d to the copper traces (the solder joints and traces not providing an electrical connection in this example) on the SOI Si photonic interposer 130, to the support bars 140a, 140b (described below), then ultimately to the heat sink 110 via the TIM 170.

The support bars 140a, 140b are affixed to the top surface of the SOI Si photonic interposer 130, e.g., respectively by means of thermal glue (TIM) 171a, 171b or by means of solder joints (not shown). The support bars 140a and 140b may be positioned on lateral opposite sides of the GCSE laser chip 120. By resting the heat sink 110 directly on the support bars 140a, 140b, a "bridge" over the GCSE laser chip 120 is formed, in a manner that prevents the heat sink 110 from touching any surface of the GCSE laser chip 120. To ensure this, the support bars 140a, 140b are particularly dimensioned to be at a taller height (from the SOI Si photonic interposer 130) than the GCSE laser chip 120 thickness (also referred to herein as a height of the laser chip) plus the height of the solder joints 150a-150d, leaving a heat sink air gap 142 between the heat sink 110 and the GCSE laser chip 120. The solder joints 150a-150d can be placed on top of Si layer 123 and around the GCSE laser chip 120 to further spread the heat. The primary heat dissipation paths (indicated by arrows 148) direct heat away from the GCSE laser chip 120, and up towards the heat sink 110 (via the support bars 140a,140b). In one example, thermal conduction on the substrate 160 between the solder joints 150a-150d and the support bars 140a, 140b may be through the silicon material. In another example, thermal conduction on the substrate 130 between the solder joints 150a-150d and the support bars 140a, 140b may be via conductive material (e.g., copper pad) disposed on the substrate 160. By fixing the heat sink 110 on top of support bars 140a, 140b to dissipate heat without physically attaching to the backside of the GCSE laser chip 120, there is no force applied to the chip during the heat sink 110 installation process. Consequently, the laser 100 has a distinct configuration that allows for thermal management elements to be integrated therein, while avoiding the drawbacks (e.g., chip damage or deformation) often encountered in conventional approaches that attach heat sinks directly to the chip. There may be secondary heat dissipation paths (indicated by arrows 149) through the solder joints 150b, 150c and through two through-silicon vias (TSV) 151a, 151b towards the substrate 160. The two TSV are shown to tunnel from the GCSE laser chip 120 down to the substrate 160 by going through the SOI Si photonic interposer 130. Also shown, are two additional solder joints 150b, 150c that can be used to bond the two TSV 151a, 151b to the GCSE laser chip 120.

Figure 2:
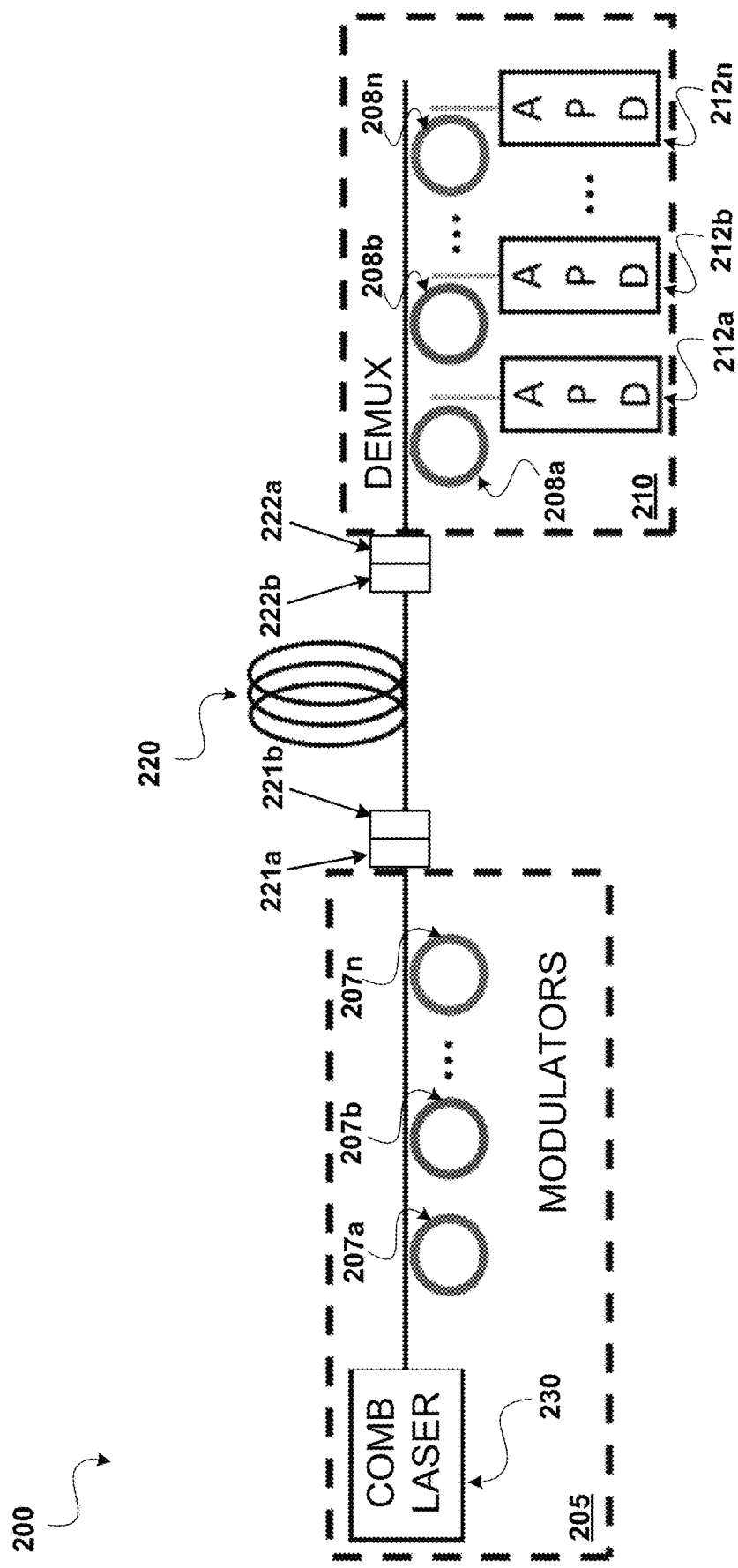
FIG. 2 is a diagram of an example of a Dense Wavelength Division Multiplexing (DWDM) silicon photonics optical system that can include the GCSE comb laser shown in FIG. 1, according to some embodiments.

In FIG. 2, a diagram of a DWDM system 200 is illustrated, serving as an example of a system that can utilize the GCSE laser configured with the thermal management elements. The DWDM system 200 can include DWDM photonic interconnects based on silicon photonics. In general, FIG. 2 illustrates the system 200 as including an optical link 220 that is physically coupling an optical transmitter module (Tx) 205 for transmitting information modulated onto optical signals that are received by an optical receiver module (Rx) 210. Further, in the illustrated example, the optical transmitter module 205 includes a multi-wavelength laser, shown as comb laser 230, that produces light at various wavelengths for the optical signal. By implementing the comb laser 230 with the disclosed integrated thermal management elements (shown in FIG. 1), the laser 230 can self-adjust to compensate for temperature-induced drift and stabilize its lasing wavelengths.

The optical transmitter 205 further includes several key components for transmitting an optical signal: the multi-wavelength light source, shown as comb laser 230; optical modulators, shown as several microring resonator modulators 207a-207n. The optical receiver module 210 is shown to include several key components for receiving an optical signal: optical demultiplexer, shown as microring resonator filters 208a-208n; and corresponding photodetectors 212a-212n. As alluded to above, DWDM technology is widely used in optical telecommunications to increase the system capacity (e.g., without replacing existing backbone optical fiber network). A mechanism for increasing capacity can be using a multi-wavelength light source at the optical transmitter module 205, for instance comb laser 230 and modulators 207. The optical transmitter module 205 can multiplex N independent data streams, and modulate them onto N different wavelengths $\lambda_1 \ldots \lambda_N$ of light, typically having 0.1 nm-3 nm of channel spacing. For example, mirroring resonator modulators 207a can be set to have a resonance wavelength $\lambda_1$, microring resonator 207b set to wavelength $λ_2$, and microring resonator 207n set to wavelength $λ_N$. These data streams generated by the optical transmitter module 205 can then be sent together and propagated through an optical fiber 220, such as an optical cable, for a long distance (e.g., kilometers). Subsequently, at the optical receiver module 210 the optical demultiplexer can include microring filters that are tuned for the N corresponding wavelengths, namely $λ_1 … λ_N$. As seen in FIG. 2, the optical demultiplexer can be implemented as multiple microring filters 208a-208n that can be used to demultiplex the optical signal at a corresponding wavelength. For example, mirroring filter 208a can be set to filter wavelength $λ_1$, microring filter 208b can be set to wavelength $λ_2$, and microring filter 208n can be set to wavelength $λ_N$. A compact and scalable DWDM photonic link can be implemented by using microring resonators to implement the modulators 207a-207n coupling to a transmit waveguide 209 (at the Tx-end), and the filters 208a-208n coupling to a receive waveguide 211 (at the Rx-end). The transmit waveguide 209 may couple to an optical connector 221a, and the receive waveguide 211 may couple to an optical connector 222a. Optical connectors 221a, 222a may be connected via an optical fiber 220 terminated with optical connector 221b on the optical transmitter module 205 end, and optical connector 222b on the optical receiver module 210 end. In addition, the optical receiver module 210 includes a series of photodetectors 212a-212n, where each photodetector 212a-212n is correspondingly connected to a respective microring filter 208a-208n. SiGe APDs can be used as photodetectors 212a-212n. The microring resonator filters 208a-208n and the photodetectors 212a-212n can serve as the de-multiplexer to convert the multi-wavelength optical signals back to N independent electrical data streams simultaneously.

Figure 3B:
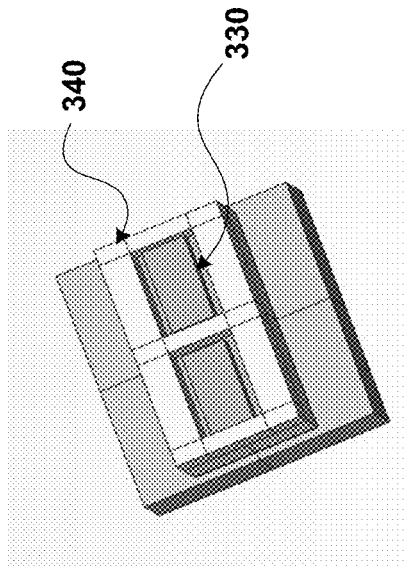
FIG. 3B is a diagram of another example of solder joints and support bars to implements some of the thermal management elements shown in FIG. 1, according to some embodiments.
Figure 3C:
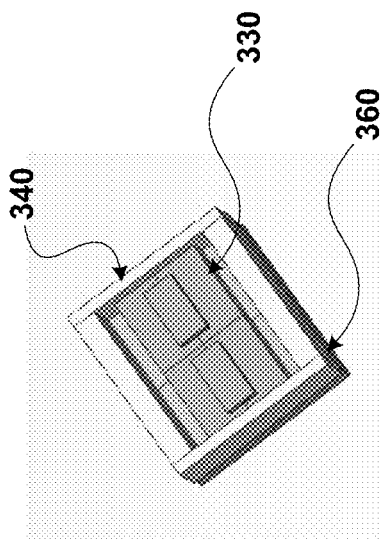
FIG. 3C is a diagram of yet another example of solder joints and support bars to implements some of the thermal management elements shown in FIG. 1, according to some embodiments.
Figure 3A:
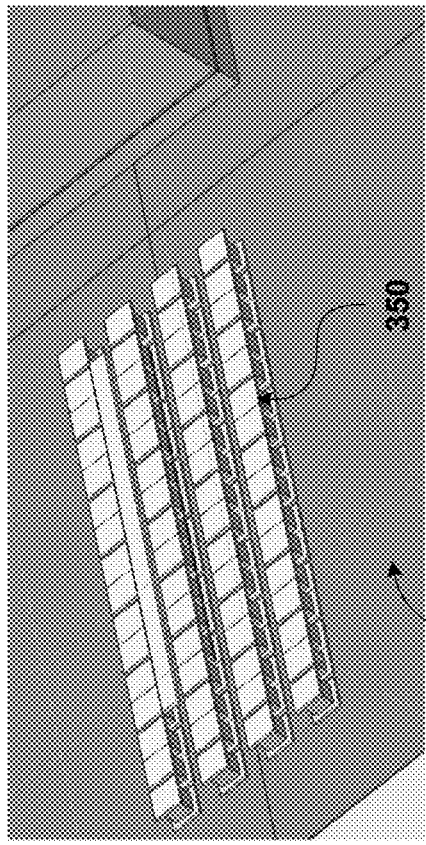
FIG. 3A is a diagram of an example of solder joints and support bars to implements some of the thermal management elements shown in FIG. 1, according to some embodiments.

FIG. 3A illustrates an example of solder joints that implement some of the thermal management elements shown in FIG. 1. Particularly, FIG. 3A illustrates multiple dense individual solder joints 350 that can be disposed along the surface of the SOI Si photonic interposer 330 to help to extract heat from a laser chips efficiently.

FIG. 3B illustrates an example of support bars that implement some of the thermal management elements shown in FIG. 1. Support bars 340 further spread out the heat surrounding the chip(s) with close proximity and can have variable shapes. In the example of FIG. 3B, the heat spreader of the support bar 340 is arranged on the SOI Si photonic interposer 330.

FIG. 3C illustrates another example of support bars. In the example of FIG. 3C, the heat spreader of the support bar 340 is arranged on the substrate 360, instead of on the interposer 330.

Referring now to FIG. 4A, a diagram of another example of a system 400 including a GCSE comb laser with integrated thermal management elements including a thermal conductive sheet 471 is shown. The thermal conductive sheet 471 can be a substantially thin (e.g., 0.1 mm thick) sheet that is constructed of graphite or graphene. Rather than the heat sink 410 directly resting on top of the support bars 440a, 440b (as shown in FIG. 1), the configuration in FIG. 4A uses the thermal conductive sheet 471 as an additional interface that is sandwiched between the heat sink 410 (on top) and the support bars 440 and GCSE chip 420 (below). In the example, the thermal conductive sheet 471 is wrapped around a stiffener block 475 to allow the thermal conductive sheet 471 to come into physical contact with the backside of the GCSE laser chip 420, but without applying any force to the chip 420.

Also, FIG. 4A illustrates use of the thermal interface material (TIM) 470. The TIM 470 is interposed between the bottom surface of the heat sink 410 and the portion of the thermal conductive sheet 471 that covers the top of the stiffener block 475. Since the thermal conductive sheet 471 comes into physical and thermal contact with the backside of the GCSE chip laser 420, heat from the chip 420 is conducted away from the top surface of the chip 420 in a dissipation path 448 at the backside of the GCSE laser chip 420 (indicated by an arrow). The dissipation path 448 illustrates that heat is extracted from the GCSE laser chip 420 towards the conductive sheet 471. By employing the thermal conductive sheet 471, backside heat dissipation remains efficient. For example, thermal conductivity of a thermal conductive sheet 471 sheet can be approximately greater than 1000 W/m-K. Also, there may be a layer of thermal glue 476 on the bottom of the thermal conductive sheet 471 allowing the sheet 471 to remain stably in position on top of the backside of the GCSE laser chip 420. In another example, there may be a layer of thermal glue (not shown) between the top surfaces of the support bars 440a, 440b and the thermal conductive sheet 471, immediately under the stiffener block 475.

FIG. 4B illustrates a top view of the laser 400 shown in FIG. 4A. The example prominently shows two GCSE laser chips 420a, 420b that are length-wise aligned with each other (forming a straight line). As seen, the support bars 440a, 440b are situated on either side of the chips 420a, 420b. Each of the support bars 440a, 440b have a length that extends for at least the length of both GCSE laser chips 420a, 420b and the gap between them. The support bars 440a and 440b are spaced apart with the space wider than the widths of each GCSE laser chip 520a, 520b.

Figure 5A:
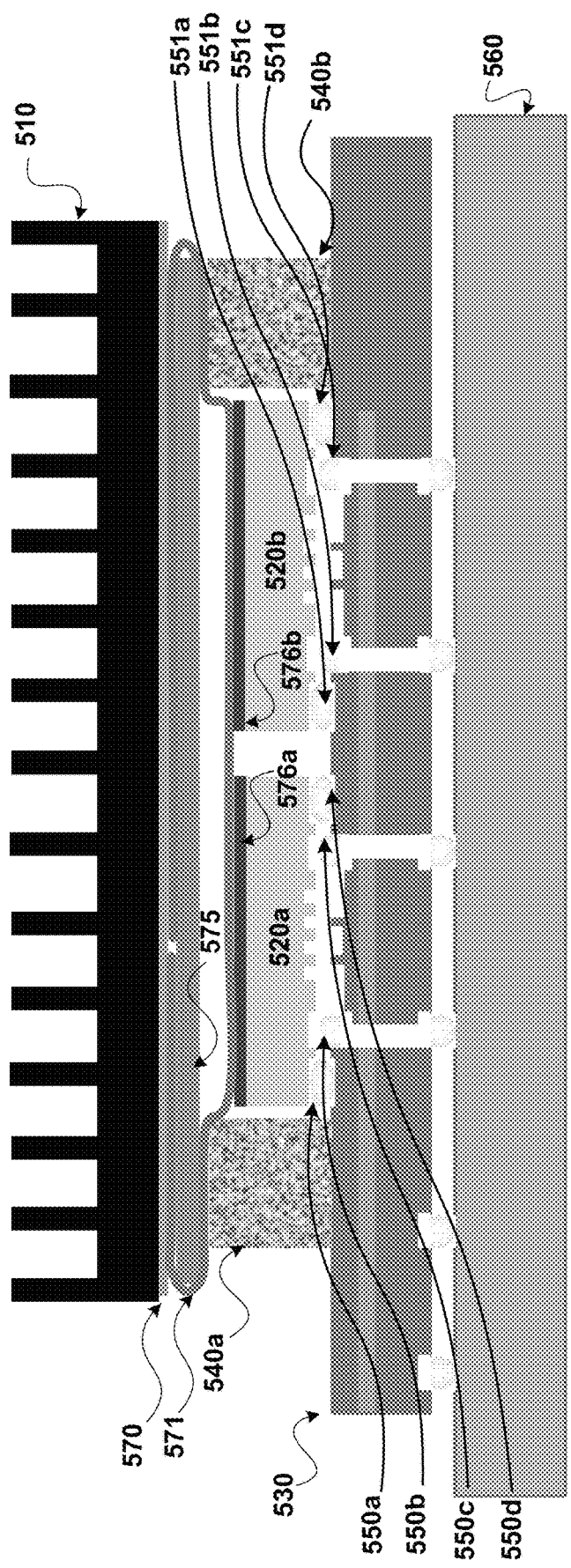
FIG. 5A is a diagram of yet another example of a GCSE comb laser with integrated thermal management elements including multiple GCSE laser chips sharing the same thermal conductive sheet, according to some embodiments.

In FIG. 5A, a diagram of yet another example of a system 500 including a GCSE comb laser having multiple GCSE laser chips 520a, 520b sharing the same heat sink 510 and thermal conductive sheet 571 is shown. Heat off of the top surface of the GCSE laser chips 520a, 520b is conducted in-plane of an outer surface of the thermal conducting sheet 571. For example, the bottom surface of the thermal conductive sheet 571 physically contacts the backside of both of the GCSE laser chips 520a, 520b. Also, the thermal conductive sheet 571 wraps around to the top surface of the stiffener block 575, thus coming into contact with the bottom of the heat sink 510 resting on top of the stiffener block 575. As shown, the stiffener block 575 is situated on top of the support bars 540a, 540b forming the "bridge" over the GCSE laser chips 520a, 520b that the heat sink 510 rests on top of. Support bars 540a, 540b are to support the compression force of the heat sink 510 on the thermal conducting sheet 571 supported by the stiffener block 575.

Also, shown, the TIM 570 is a layer between the heat sink 510 and the thermal conductive sheet 571. Further, each of the GCSE laser chips 520a, 520b can have a layer of thermal glue 576a, 576b respectively on the top surface to allow the thermal conductive sheet 571 to stay in place when in contact. In this configuration of the laser 500, multiple GCSE laser chips 520a, 520b can share the same thermal conductive sheet 571, support bars 540a, 540b, and heat sink 510 reducing the amount of thermal management elements needed in the implementation. However, there are different solder joints used for the multiple GCSE laser chips 520a, 520b. In the example, solder joints 550a-550d correspond to GCSE laser chip 520a and solder joints 551a-551d correspond to GCSE laser chip 520b.

Figure 5B:
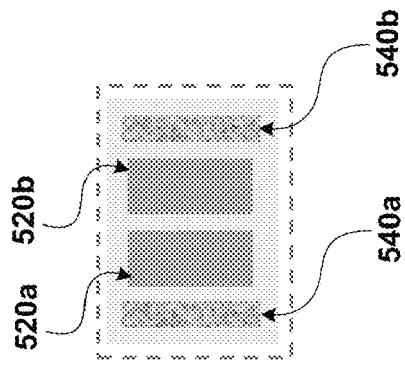
FIG. 5B depicts a top view of the GCSE comb laser with integrated thermal management elements shown in FIG. 5A.

FIG. 5B illustrates a top view of the laser 500 shown in FIG. 5A. The example prominently shows two GCSE laser chips 520*a*, 520*b* that are width-wise aligned with each other (forming a straight line). As seen, the support bars 540*a*, 540*b* are situated on either side of the chips 520*a*, 520*b*. Each of the support bars 540*a*, 540*b* have a length that extends for at least the length of each GCSE laser chips 520*a*, 520*b*. The support bars 540*a* and 540*b* are spaced apart with the space wider than the widths of both GCSE laser chips 520*a*, 520*b*.

Figure 6A:
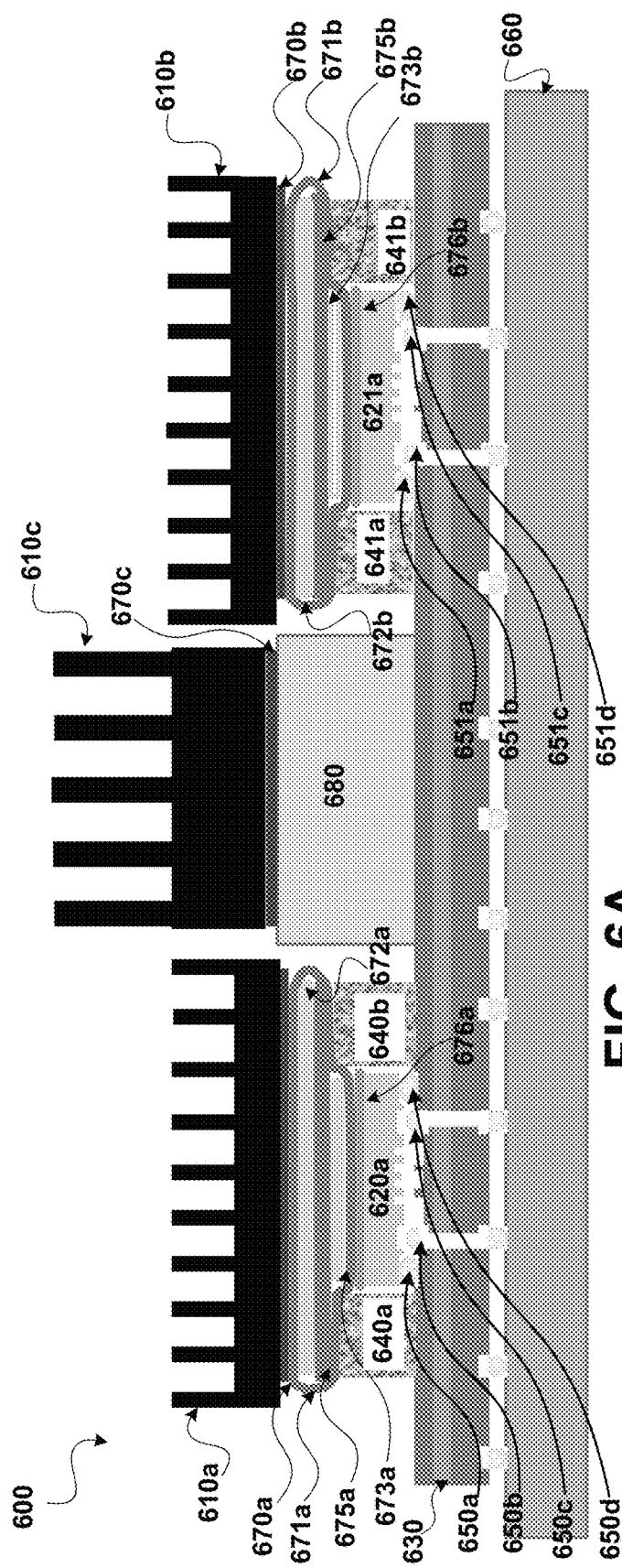
FIG. 6A is a diagram of yet another example of a GCSE comb laser with integrated thermal management elements including a heat sink for an application specific integrated circuit (ASIC) separating heat sinks for multiple GCSE laser chips, according to some embodiments.

FIG. 6A depicts an example system 600 consisting of GCSE comb lasers 620*a*, 621*a* where a heat sink 610*c* and an ASIC 680 separates heat sinks 610*a*, 610*b* for two GCSE laser chips 620*a*, 621*a* respectively. Heat sink 610*c* for the ASIC 680 may be separated from the heat sinks 610*a*, 610*b* for the GCSE array including GCSE laser chips 620*a*, 621*a*. For instance, the heat sink 610*c* for ASIC 680 may be large enough to spread the GCSE laser chips 620*a*, 621*a* farther apart from the ASIC 680. In detail, the GCSE laser chip 620*a* has a heat sink 610*a* that is situated on top of thermal conductive sheet 671*a* and support bars 640*a*, 640*b*. Similarly, the GCSE laser chip 621*a* has a heat sink 610*b* that is situated on top of thermal conductive sheet 671*b* and support bars 641*a*, 641*b*. Solder joints 650*a*-650*d* correspond to GCSE laser chip 620*a* and solder joints 651*a*-651*d* correspond to GCSE laser chip 621*a*.

Particularly, the thermal conductive sheet 671*a* wraps around a lower sponge 673*a*, an upper sponge 672*a*, and a stiffener block 675*a*. The lower sponge 673*a* is to provide just enough pressure for thermal glue 676*a* to be adhered to GCSE laser chip 620*a* during manufacturing. Accordingly, the thermal conducting sheet 671*a* remains in place for reliable and even-force attachment and staying in contact with GCSE laser chip 620*a* even if the support bars 640*a*, 640*b* may have height variations. The upper sponge 672*a* is to provide adequate even force for the thermal conducting sheet 671*a* to be in contact with the bottom surface of the heat sink 610*a* via TIM 670*a*, even if the bottom surface of the heat sink 610*a* may not have perfect flatness. The stiffener block 675*a*, the upper sponge 672*a*, and the lower sponge 673*a* may or may not be made of thermally non-conductive material, as majority of the heat extracted from the backside of the GCSE laser chip 620*a* is along the surface areas of the thermal conducting sheet 671*a* that contacts with the GCSE laser chip 620*a* (via TIM 676*a*) and the heat sink 610*a* (via TIM 670*a*).

The thermal conductive sheet 671*b* has a similar configuration as described with respect to thermal conductive sheet 671*a*, and wraps around a lower sponge 673*b*, an upper sponge 672*b*, and a stiffener block 675*b*. The top surface of the thermal conducting sheet 671*b* contacts the bottom of heat sink 610*b* by having TIM 670*b* layered in between.

Figure 6B:
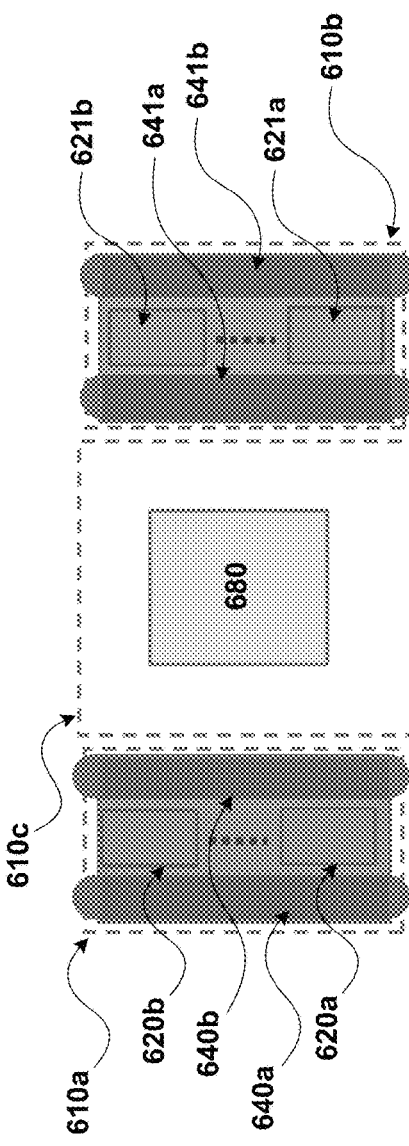
FIG. 6B depicts a top view of the GCSE comb laser with integrated thermal management elements shown in FIG. 6A.

FIG. 6B illustrates a top view of the laser 600 shown in FIG. 6A. This view shows that two GCSE laser chips 620*a*, 621*a* are separated from two additional GCSE laser chips 620*a*, 621*b* by the ASIC 680. This example also serves to illustrate that the area of the heat sink for the ASIC 680 (indicated by dashed box) may be larger than the area of the ASIC 680 itself, thereby spreading the GCSE arrays even farther apart from ASIC 680. In this case, this spacing between the ASIC 680 and the GCSE arrays can serve as a form of thermal management. There may be more than two GCSE on each side of the ASIC 680 where the support bars 640*a*, 640*b*, 641*a*, 641*b* may be correspondingly longer to cover each GCSE array.

FIG. 7A shows a system 700 including GCSE comb lasers. Further, the comb laser of the system 700 includes the ASIC 780 separating multiple GCSE laser chips 720*a*, 721*a*. Additionally, the ASIC 780 and both GCSE laser chips 720*a*, 721*a*, share the same heat sink 710. As shown, the heat sink 710 has a length that covers the length of both GCSE laser chips 720*a*, 721*a* and the ASIC 780 separating them. This configuration of laser 700 eliminates the need to use multiple heat sinks (as shown in FIG. 6A). In the illustrated example, the heat sink 710 sits over GCSE laser chip 720*a*, contacting its thermal conductive sheet 771*a* and support blocks 740*a*, 740*b*. Similarly, the heat sink 710 lays over GCSE laser chip 721*a*, contacting thermal conductive sheet 771*b* and support blocks 741*a*, 741*b*. Solder joints 750*a*-750*d* correspond to GCSE laser chip 720*a* and solder joints 751*a*-751*d* correspond to GCSE laser chip 721*a*.

The thermal conductive sheets 771*a*, 771*b* have similar configurations as described with respect to thermal conductive sheets in FIG. 6A. For example, thermal conductive sheet 771*a* and wraps around a lower sponge 773*a*, an upper sponge 772*a*, and a stiffener block 775*a*. Moreover, there is a single TIM 770 that serves as the interface between the heat sink 710 on and the contacting surfaces for each of the GCSE laser chips 720*a*, 721*a*, and the ASIC 780. Accordingly, by using a common heat sink 710 (or cold plate) for the ASIC 780 and GCSE arrays including GCSE laser chips 720*a*, 721*a*; the GCSE arrays may be placed closer to ASIC if thermal conditions permit.

FIG. 7B illustrates a top view of the laser 700 shown in FIG. 7A. This view shows that two GCSE laser chips 720*a*, 720*b* are separated from two additional GCSE laser chips 721*a*, 721*b* by the ASIC 780. This example also serves to illustrate that the area of the common heat sink 710 (indicated by dashed box) may be larger enough to cover the area of the ASIC 780 itself, and the GCSE laser chips 720*a*, 720*b*, 721*a*, 721*b*. This arrangement, as alluded to above, allows the GCSE arrays to be placed closer to the ASIC 780 reducing the footprint. The lower sponges 773*a*, 773*b* allow proper thermal contacts for the thermal conductive sheets 771*a*, 771*b* to the GCSE laser chips via TIM 776*a*, 776*b*, even if the heights of the support bars 740*a*, 740*b*, 741*a*, 741*b* may vary. The upper sponges 772*a*, 772*b* also allow proper thermal contact for the thermal conductive sheets 771*a*, 771*b* to the heat sink 710 via the TIM 770 even if the bottom surface of the heat sink 710 may not have a perfect flatness.

Figure 8:
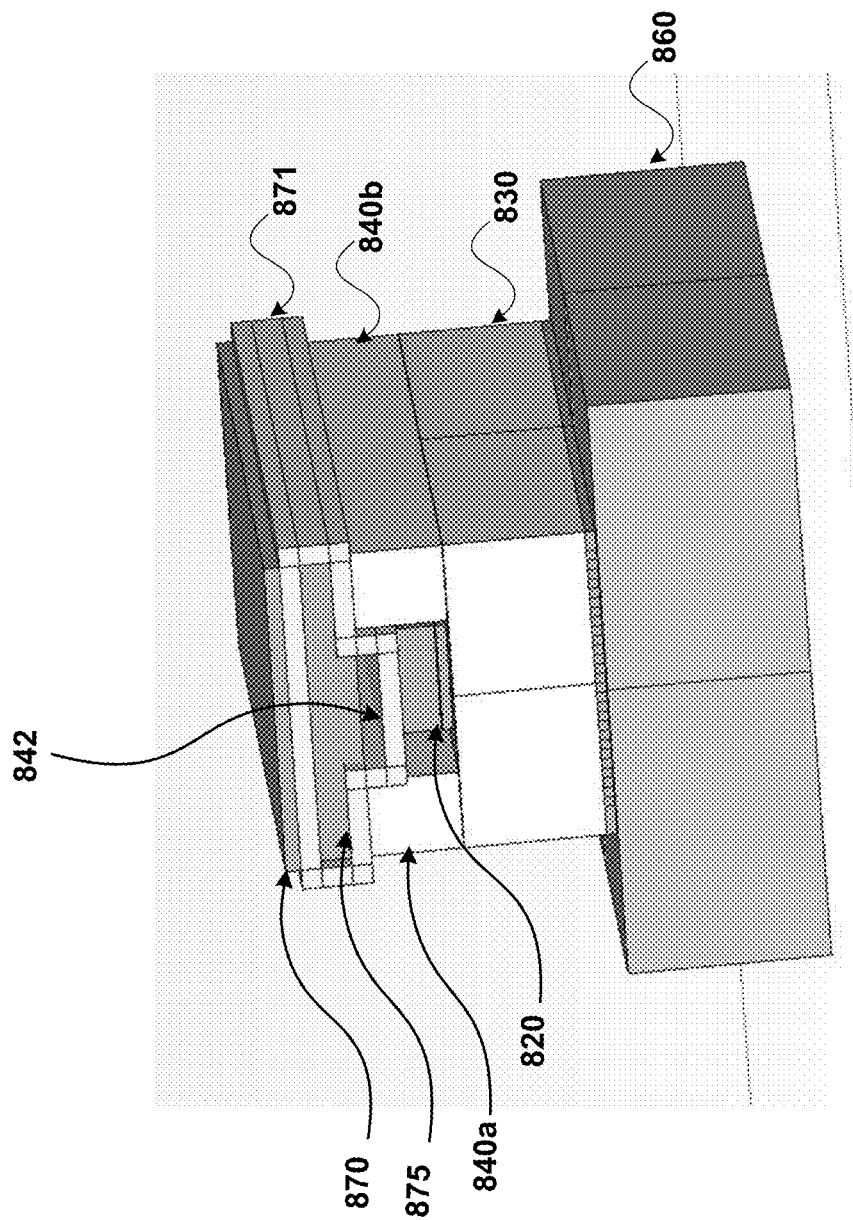
FIG. 8 is a diagram of a stiffener model that can be used to implements some of the thermal management elements of the GCSE comb laser shown in FIG. 3A, according to some embodiments.

FIG. 8 depicts of a thermal simulation model 800 that can be used to implements some of the thermal management elements of the GCSE comb laser shown in FIG. 4A, for example. As shown, the organic substrate 860 can be a bottom layer. The SOI Si interposer 830 can be a layer disposed on the substrate 860. Next, a GCSE laser chip 820 can be situated on top of the SOI Si interposer 830, in between the support bars 840*a*, 840*b*. The support bars 840*a*, 840*a* are shown as two bars, on either side of the SOI Si interposer 830, that extend upward around the GCSE laser chip 820 (forming a trench to insert the GCSE laser chip 820). A thermal conductive sheet 871 can be formed around the stiffener block 875. The thermal conductive sheet 871 can have dimensions that narrows at the bottom surface of the stiffener block 875 allowing that portion of the sheet 871 to fit down into the opening above the SOI Si interposer 830 top surface (between support blocks 840*a*, 840*b*). By inserting a portion of the thermal conductive sheet 871 down towards the SOI Si interposer 830 top surface where the GCSE laser chip 820 is positioned, that portion of the thermal conductive sheet 871 can come into physical contact with the GCSE laser chip 820 in a manner that allows heat to be dissipated from that backend of the GCSE laser chip 820. There may be a gap 842 formed between the bottom of the stiffener block 875 and the surface of the thermally conductive sheet 871 above the GCSE laser chip 820. The gap 842 may be an air gap in one example where the thermally conductive sheet 871 may be attached to the GCSE laser chip 820 with a thermal glue. The gap 842 may be occupied by a sponge in another example where the sponge may provide light compression of the thermally conductive sheet 871 on the GCSE laser chip 820. On top of thermal conductive sheet 871, a TIM 870 layer can be placed. This TIM 870 layer can be can be thin, for example 3 mil in thickness. This thermal simulation model 800 can provide the disclosed thermal management techniques for a GCSE comb laser as described above.

Accordingly, the embodiments disclosed herein can GCSE comb laser including thermal management elements, which is a practical solution for "on-chip" laser implementations. That is, a package process for the disclosed GCSE comb laser remains compatible with standard procedures, even with the inclusion of additional thermal movement elements, such as heat sinks and thermal conductive sheets. Furthermore, the distinct configurations allows for no or little force to be applied to the laser chips when utilizing a heat sink, thereby alleviate the risk of chip deformation and damage. The various designs for the GCSE comb laser including thermal management elements is a scalable, in order to achieve the same heat extraction for one or multiple laser chips integrated onto the same interposer. The same concept can be applied to other chip packaging and thermal management approaches, in cases where the chip may be sensitive or fragile to mechanical force during the packaging process.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system of a GCSE comb laser, comprising:
   a GCSE laser chip;
   two support bars, wherein the GCSE laser chip is positioned between the two support bars, the two support bars being spaced apart from respective sides of the GCSE laser chip, and each support bar has a height that is higher than a height of the GCSE laser chip;
   a stiffener block positioned on top of the two support bars;
   a heat sink positioned on top of the stiffener block; and
   a thermal conductive sheet wrapped around the stiffener block, wherein:
      the thermal conductive sheet is unbonded to the heat sink,
      a first region of the thermal conductive sheet is pinned between a heat sink-facing surface of the stiffener block and a stiffener block-facing surface of the heat sink,
      a second region of the thermal conductive sheet hangs below a GCSE laser chip facing-surface of the stiffener block such that the second region of the thermal conductive sheet contacts a stiffener block-facing surface of the GCSE laser chip, and the heat sink conducts heat away from the stiffener block-facing surface of the GCSE laser chip via the thermal conductive sheet.

2. The system of claim 1, further comprising:
a thermal interface material positioned between the first region of the thermal conductive sheet and the heat sink.

3. The system of claim 1, wherein the thermal conductive sheet comprises a graphite sheet.

4. The system of claim 1, wherein the thermal conductive sheet comprises a graphene sheet.

5. The system of claim 1, further comprising a SOI Si photonic interposer layer beneath the GCSE laser chip.

6. The system of claim 1, further comprising solder joints to bond the GCSE laser chip on to the SOI Si photonic interposer.

7. The system of claim 6, wherein the solder joints extract heat from the GCSE laser chip and route the extracted heat along a Si layer formed on top of the SOI Si photonic interposer.

8. The system of claim 6, comprising:
a substrate beneath the SOI Si photonic interposer;
through silicon vias (TSV) tunneling from the GCSE laser chip to the substrate through the SOI Si photonic interposer; and
additional solder joints to bond the two TSV to the GCSE laser chip.

9. The system of claim 8, wherein heat from the GCSE laser chip dissipates through the additional solder joints towards the substrate via the two TSV.

* * * * *